United States Patent [19]

Maeda et al.

[11] Patent Number: 5,130,775
[45] Date of Patent: Jul. 14, 1992

[54] AMORPHOUS PHOTO-DETECTING ELEMENT WITH SPATIAL FILTER

[75] Inventors: Shosaku Maeda; Takeshi Kawai; Fumio Koike, all of Kanagawa, Japan

[73] Assignee: Yamatake-Honeywell Co., Ltd., Tokyo, Japan

[21] Appl. No.: 539,830

[22] Filed: Jun. 18, 1990

Related U.S. Application Data

[63] Continuation-in-part of Ser. No. 431,876, Nov. 6, 1989, abandoned.

[30] Foreign Application Priority Data

Nov. 16, 1988 [JP] Japan .................................. 63-287591

[51] Int. Cl.$^5$ ............................................. H01L 27/14
[52] U.S. Cl. ................................................ 357/30; 357/2; 357/58; 357/68; 136/256; 136/257; 136/258; 250/206.1
[58] Field of Search ............... 357/30 P, 30 Q, 30 K, 357/30 J, 68, 2, 58, 55, 30 H, 32; 250/206.1, 206.2; 136/256, 257, 258, 258 PC, 258 AM

[56] References Cited

U.S. PATENT DOCUMENTS

| | | | |
|---|---|---|---|
| 4,491,682 | 1/1985 | Hamakawa et al. | 357/30 Q |
| 4,532,536 | 7/1985 | Hatanaku et al. | 357/30 Q |
| 4,536,607 | 8/1985 | Wiesmann | 357/30 J |
| 4,539,431 | 9/1985 | Moddel et al. | 357/30 J |
| 4,543,443 | 9/1985 | Moeller et al. | 357/71 X |
| 4,693,599 | 9/1987 | Margulis et al. | 357/30 Q |
| 4,792,670 | 12/1988 | Furaya et al. | 357/2 |
| 4,803,375 | 2/1989 | Saito et al. | 357/30 Q |
| 4,885,622 | 12/1989 | Uchiyama et al. | 357/2 |
| 5,011,567 | 4/1991 | Gonsidrawski | 156/643 |
| 5,019,176 | 5/1991 | Brandhorst, Jr. et al. | 357/30 J X |

OTHER PUBLICATIONS

Johnson et al., "Method for Making Submicron Dimensions in Structures Using Sidewall Image Transfer Techniques", *IBM Tech. Discl. Bull.*, vol. 26, No. 9, Feb. '84, 4587.

No Author, "Short-Channel Field-Effect Transistor", *IBM Technical Disclosure Bulletin*, vol. 32, No. 3A, Aug. 1989, pp. 77–78.

Chan, "Maskless, Selective Electroetching for Metal Patterning", *J. Appl. Phys.*, 58(4), 15 Aug. 1985, pp. 1704–1705.

Sinton et al., "Simplified Backside-Contact Silicon Solar Cell Designs for One-Sun and Concentrator Applications", *Proc. European Community Photovoltaic Solar Energy Conference*, Friburg, W. Germany, Sep. 1989, pp. 1–4.

Verlinden et al., "High Efficiency Interdigitated Back Contact Silicon Solar Cells", Conference Record, 19th IEEE Photovoltaic Specialists Conf., New Orleans, La., May 4–8, 1987, Published Oct. 1987, pp. 405–410.

*Primary Examiner*—William Mintel
*Attorney, Agent, or Firm*—Whitham & Marhoefer

[57] ABSTRACT

In this sensitive, relatively inexpensive to manufacture, photo-detector, one surface of an amorphous silicon photovoltaic element is bonded to a thin transparent conductive layer formed on an insulating base. A conductive pattern is formed on the opposite surface of the element. The conductive layer may be formed of indium-tin oxide (ITO) and the photovoltaic element may be an element with an intrinsic semiconducting layer between p and n doped layers. The photovoltaic element generates component currents in response to photons passing through the transparent base and conducting layer. Those current components flowing predominantly in a direction at right angles to the photovoltaic element surfaces are summed by the conductive pattern which acts as a spatial filter, responsive to desired ones of these components and relatively unresponsive to other current components. The spatial filter conductive pattern and the transparent conducting layer may be coupled as the input to a suitable high impedance current detector.

16 Claims, 4 Drawing Sheets

AMORPHOUS PHOTO-DETECTING ELEMENT WITH SPATIAL FILTER

BACKGROUND OF THE INVENTION

This application is a continuation-in-part of U.S. application Ser. No. 07/431,876, filed Nov. 6, 1989, now abandoned.

FIELD OF THE INVENTION

This invention generally relates to a photo-detecting elements and, in particular, to photo voltaic photo-detecting elements having high accuracy and high sensitivity and which can be produced by a simple process.

DESCRIPTION OF THE PRIOR ART

A conventionally known type of photo-detecting element comprises a mono-crystalline silicon (Si) solar battery of a type invented by Rin Kobayashi, a member of the Japanese Society of Instrument and Control Engineers (SICE), in 1979. In this photo-detecting element, the mono-crystalline Si solar battery is formed by etching a p-type Si portion formed on an n-type Si substrate and adding a correspondingly shaped electrode layer pattern.

Such a conventional mono-crystalline solar battery, however, is extremely expensive. Also, when it is employed in combination with a simple spatial film pattern, such as a spatial filter, it is necessary to etch both the electrode layer and the p-type Si portion or n-type Si portion.

The term "spatial filter" is well understood in the photosensor art and other arts, and such a device will typically used to enhance the ability of the photosensor to detect motion, position, size of an object and the like by causing distinct electrical responses to light impinging on different locations on the photo-detecting element. While a spatial filter is often embodied as an optical device, such as an optical mask, the term, as used herein, should be understood to include other structures such as electronic structures having a similar function.

For instance, and in further reference to the above noted photo-detecting element of Kobayashi, if a plurality of light receiving sections are provided, such as would be desirable when the photo-detecting element is intended for use as, for example, a motion detector or pattern recognition device, such sections should be separated from each other to obtain isolation therebetween. However, such a separation structure requires a plurality of photolithography, etching and other associated techniques in the manufacturing process of the solar battery. Accordingly, a number of masks must be used in the process. This makes the manufacturing process complicated and the production cost higher due to the requirement for extremely accurate alignment of the wafer and mask during a plurality of sequential fabrication steps.

As an alternative to such separation structures, it is known to use optical spatial filters in conjunction with the photo-detector. However, such an arrangement also requires careful alignment which increases expense and may reduce uniformity and consistency of performance. The use of optical filters also reduces sensitivity due to imperfect light transmission through the spatial filter.

Furthermore, manufacturing of a highly accurate spatial filter is limited by the process of miniaturization which, as a practical matter, can not be employed to a tolerance of less than 5 μm. Such a dimensional limitation also limits the sensitivity and resolution of the photo-detection device as well as other desirable qualities such as size. This limitation is particularly significant when it is desired to form a detector of the differentially sensing type for maintaining uniform operation over a range of ambient illumination levels.

OBJECTS AND SUMMARY OF THE INVENTION

It is an object of the present invention to provide an improved photo-detecting element which is capable of being produced by a reduced number of steps requiring photo-lithography, etching and other techniques requiring high accuracy alignment.

It is another object of the present invention to provide an improved photo-detecting element having a plurality of light receiving section with an improved separation structure therebetween.

It is a further object of the present invention to provide an improved photo-detecting element of high resolution and sensitivity at reduced expense.

It is a further object of the present invention to provide an improved photo-detecting element of a differentially sensing type which is relatively insensitive to changes in ambient light levels while retaining high resolution and sensitivity.

It is another further object of the present invention to provide an improved photo-detecting element including an integrally formed spatial filter.

To achieve the above and other objects of the invention, the present invention provides a photodetecting element comprising; an insulating substrate; at least one transparent electrode deposited on the insulating substrate; and at least one further electrode, wherein at least one of the transparent electrode and the further electrode forms a spatial filter; and an amorphous-silicon photovoltaic converting element formed between the transparent electrode and the further electrode.

In accordance with one aspect of the invention, a photo-detecting element is provided wherein a gap between electrodes forming a spatial filter is greater than the thickness of the amorphous-silicon photovoltaic converting element.

In accordance with a further aspect of the invention, a method of forming a photo-detecting element is provided including the steps of forming at least one first electrode on a substrate, forming an amorphous silicon photovoltaic converting device of a predetermined thickness on the first electrode, forming a conductive layer on the amorphous silicon photovoltaic converting device, and masking selected areas of the conductive layer and etching remaining areas of the conductive layer in a pattern to form a spatial filter.

In accordance with another aspect of the invention, a method is provided wherein an etching process forms separated portions of an amorphous silicon photovoltaic converting device and electrodes in registration with the separated portions of the amorphous silicon photovoltaic converting device.

The above and other objects and features of the present invention will become apparent from the following detailed description of the preferred embodiments with reference to the accompanying drawings.

DETAILED DESCRIPTION OF THE PREFERRED EMBODIMENTS

Figure 1A:
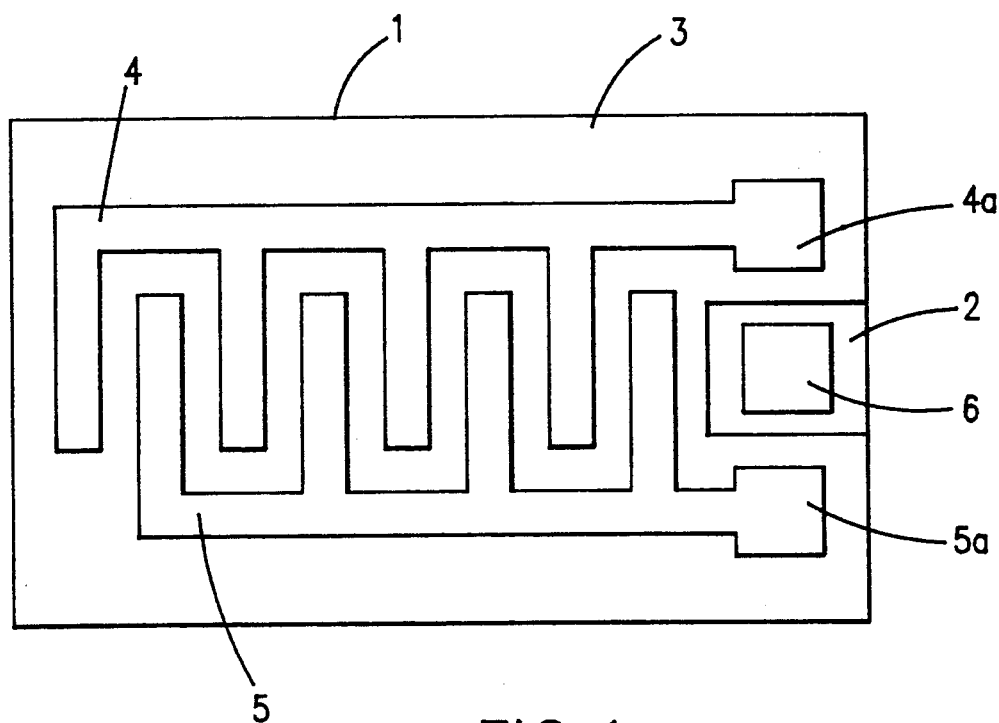
FIG. 1(a) is a plan view of a first embodiment of a photo-detecting element according to the present invention.
Figure 1B:
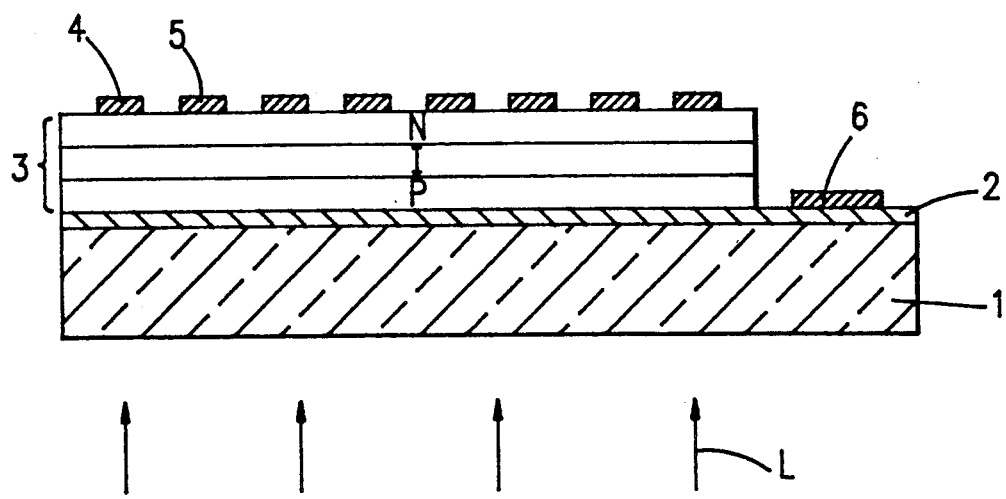
FIG. 1(b) is a cross-sectional view of a main portion of the photo-detecting element shown in FIG. 1(a)

FIGS. 1(a) and 1(b) respectively show a plan view and a cross-sectional view of a first embodiment of a photo-detecting element according to the present invention. A transparent electrode 2, comprising a lamination of an ITO layer of approximately 800 Å thickness and SiO$_2$ layer having a thickness ranging from 100 to 200 Å, is formed by vacuum vapor deposition techniques on an insulating substrate made, for example, of a transparent glass substrate 1 having a thickness of approximately 0.5 to 1.1 mm. An amorphous silicon (hereinafter abbreviated as "a-Si") photovoltaic converting element 3 is formed by laminating, on a main portion of the transparent electrode 2, except for a portion in which a common electrode is to be formed, a P-layer of approximately 150 Å, an I-layer of approximately 5000 Å and an N-layer of approximately 400 Å. Further, a metal mask is placed on the common electrode portion of the photovoltaic converting element 3 and the transparent electrode 2. In this condition, an aluminum (Al) vacuum vapor deposition technique is effected to form two sets of comb-shaped electrodes 4, 5, respectively made up of a combination of rod-shaped electrodes on the a-Si photovoltaic converting element 3, as well as a common electrode terminal 6 on the transparent electrode 2. Simultaneously, electrode terminals 4a, 5a are formed at one end of the respective comb-shaped electrodes 4, 5.

Other materials may be utilized to form these electrode structures in place of the Al vacuum vapor deposition technique, described above. For instance, the comb-shaped electrodes 4, 5 may be formed by chrome (Cr) or nickel (Ni). Common contact 6 need not necessarily be formed in this process since the transparent electrode 2 may be connected directly with a lead frame or a lead wire without forming the common electrode terminal 6.

When forming the comb-shaped electrodes 4, 5, it will usually be sufficient to cover converting element 3 with a metal mask during the vacuum vapor deposition if the accuracy required for the Al electrodes is approximately ±30 μm. A higher accuracy, if necessary, for example, ±2 μm can be achieved by forming a pattern by photolithography and etching the electrode layer. An etchant for Al used in this embodiment is one composed of H$_3$PO$_5$, HNO$_3$, CH$_3$COOH and H$_2$O, mixed in a proportion of 83.3:1:6.7:9 and heated to a temperature from 50 to 60° C.

With the above-mentioned structure, the a-Si photovoltaic converting element 3 lies between the transparent electrode 2 and the comb-shaped electrodes 4, 5 which are opposed with each other and may be interdigitated, as illustrated. The first and second comb-shaped electrodes 4, 5 form a spatial filter, so that a current generated by an external light incident to the photovoltaic converting element 3 mostly flows in the direction perpendicular to the substrate (e.g. vertical direction, as illustrated in FIG. 2) since the photovoltaic converting element 3 has a higher resistivity in the lateral direction. For this reason, signals derived between the electrode terminals 4a, 5a and the common electrode terminal are generated by light components irradiating the comb-shaped electrodes 4, 5, thereby producing similar effects as in the case of utilizing optical filters having slits or the like.

The insulation in the lateral direction is obtained by the following characteristics of a-Si. The a-Si forming the a-Si photovoltaic converting element 3 generally has a conductivity of approximately $10^{-6}$ to $10^{-7}$ (Scm$^{-1}$) in a P-layer and $10^{-9}$ to $10^{-10}$ (Scm$^{-1}$) in an I-layer. These values are relatively low, compared with mono-crystalline silicon, for example. However, the thickness of the a-Si photovoltaic converting element 3 is less than approximately 0.6 μm, even including all of the P, I and N layers. Therefore, if an interval larger than about 50 μm is provided in the lateral direction, an electric resistance obtained in the lateral direction is considerably large compared with that in the vertical direction. Further, a current generated by light readily flows in the direction perpendicular to the plane of converting element 3 (e.g. vertical, as illustrated in FIG. 2), since, in the vertical direction, diffusion exists in the P and N layers and an internal electric field exists in the I layer of the PIN structure. Further, due to the existence of diffusion and the absence of an electric field in the lateral direction, a sufficient difference in resistance value is produced based on the difference between the thickness of the N layer of 400 Å and the distance between the comb-shaped electrodes 4, 5 of 10 μm. This circumstance effectively prevents the photogenerated current from flowing in the lateral direction. Thus, a nearly insulated condition dominates in the lateral direction.

Therefore, it is not necessary to add further processes such as an etching process for providing insulation to the respective comb-shaped electrodes 4, 5. Therefore, a spatial filter can be formed in a desired shape by merely changing the pattern of the comb-shaped electrodes 4, 5. In the above embodiment, the comb-shaped electrodes 4, 5 are placed on the N-layer, however, they may be formed on the P-layer side and a common electrode provided on the N-layer side.

Figure 2A:
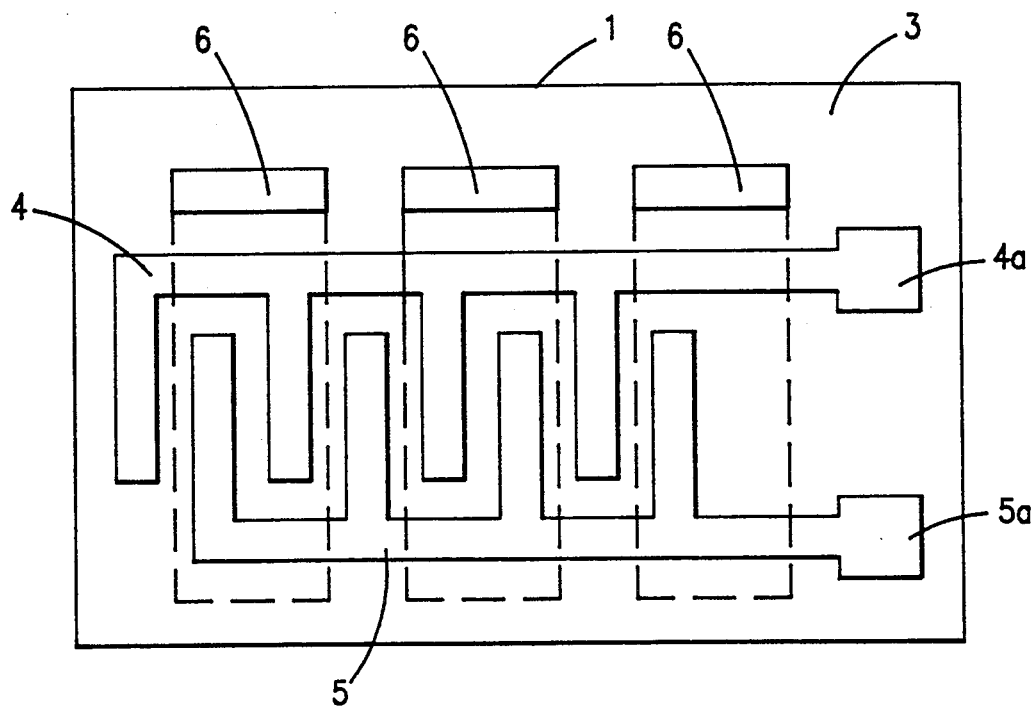
FIG. 2(a) is a plan view of another embodiment of the present invention.
Figure 2B:
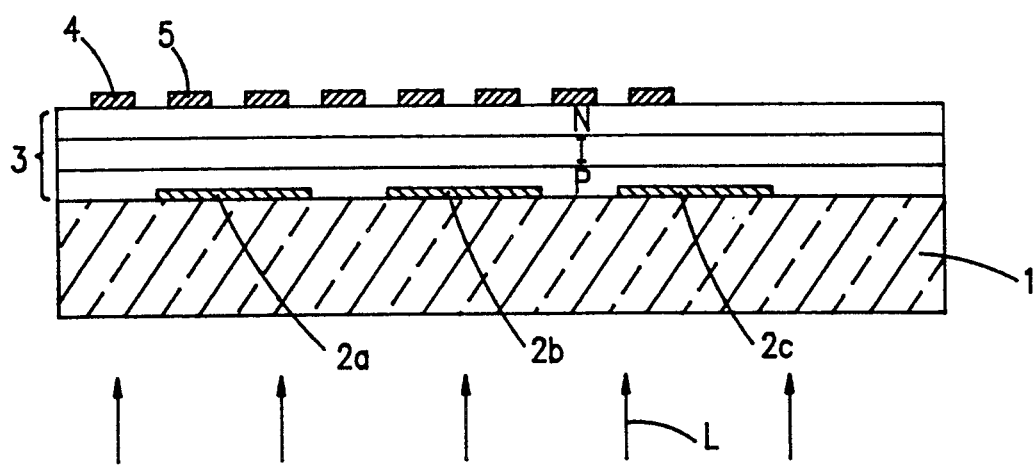
FIG. 2(b) is a cross-sectional view of a main portion of the other embodiment shown in FIG. 2(a)

In a second embodiment shown in FIGS. 2(a) and 2(b), the transparent electrode layer 2 made up of ITO and SnO$_2$ layers is formed on the glass substrate 1 in the same manner as the first embodiment. Thereafter transparent electrodes 2a, 2b and 2c, each cooperating with at least a pair of the comb-shaped electrodes 4, 5 acting as a first spatial filter and serving to produce a differential output, and the transparent electrodes serving as a second spatial filter, are formed by patterning with a photolithography technique and etching, for example, with a etchant comprising approximately 9% of HCl and heated to a temperature of approximately 60° C.

Terminals 6 may be included on electrodes 2a, 2b and 2c, as desired.

The above structure allows the electrodes at both sides of the a-Si photovoltaic converting element 3 to be used as spatial filters.

Figure 3:
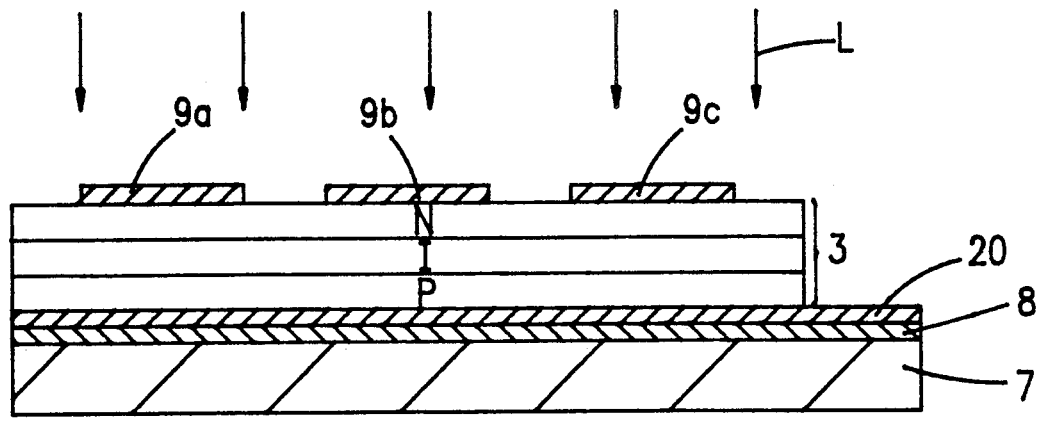
FIG. 3 is a cross-sectional view of a further embodiment of the present invention.

A third embodiment shown in FIG. 3 employs a Si substrate 7 on which an insulating layer 8, made of SiO$_2$ or the like, is deposited. Then, a metal layer or ITO/SnO$_2$ layers are laminated on the insulating layer 8 to form an electrode 20 on which an a-Si photovoltaic converting element 3 is formed. Next, on this a-Si photovoltaic converting element 3, a transparent electrode layer made of ITO/SnO$_2$ is deposited by the vacuum vapor deposition technique and etched in a similar manner to the foregoing to form transparent electrodes 9a, 9b and 9c which serve as spatial filters.

In such a structure, the insulating layer 8 may be made of Si$_3$N$_4$ which is generally employed to form semiconductor integrated circuits. Also, the electrode 20 may be shaped as desired to form a further spatial filter and made of metals such as Al, W, Cr, and so on, which are similarly employed to form semiconductor integrated circuits. Further, if the photo-detecting element is formed on active elements formed on the Si substrate 7, portions on the insulating layer 8 contacted with the active elements may be etched, after epitaxial growth and diffusion processes, to connect the electrode 20 with active elements beneath the insulating layer 8, thereby enabling signal processing to be provided on the same chip or substrate.

Figure 4A:
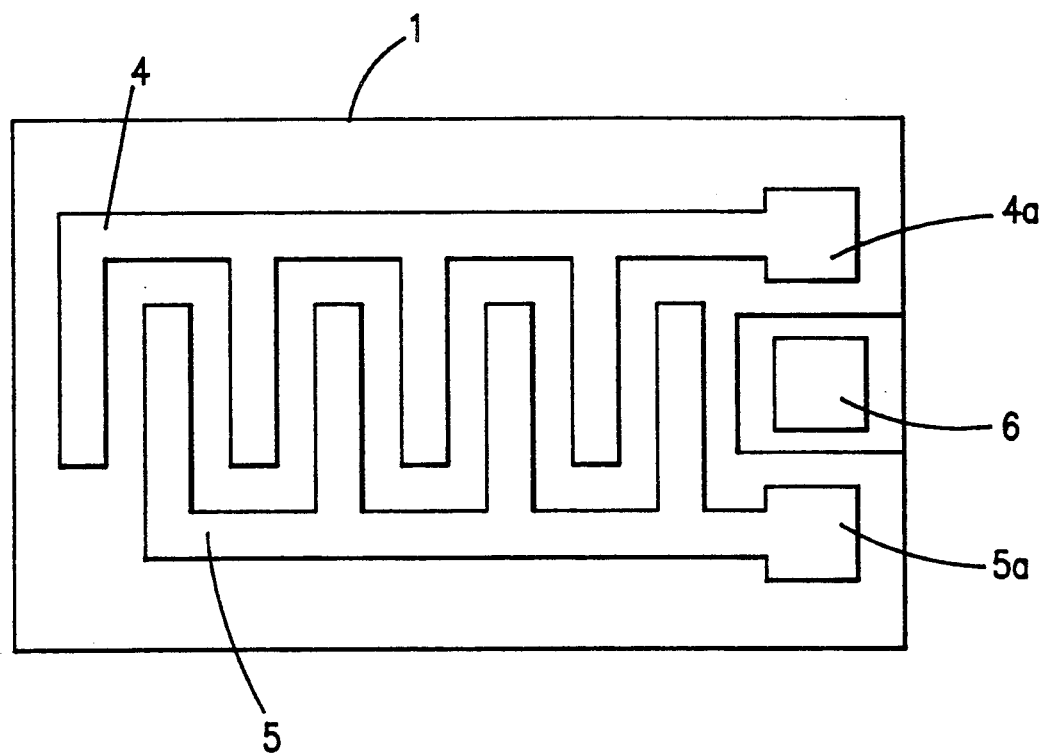
FIG. 4(a) is a plan view of a yet further embodiment of the present invention.
Figure 4B:
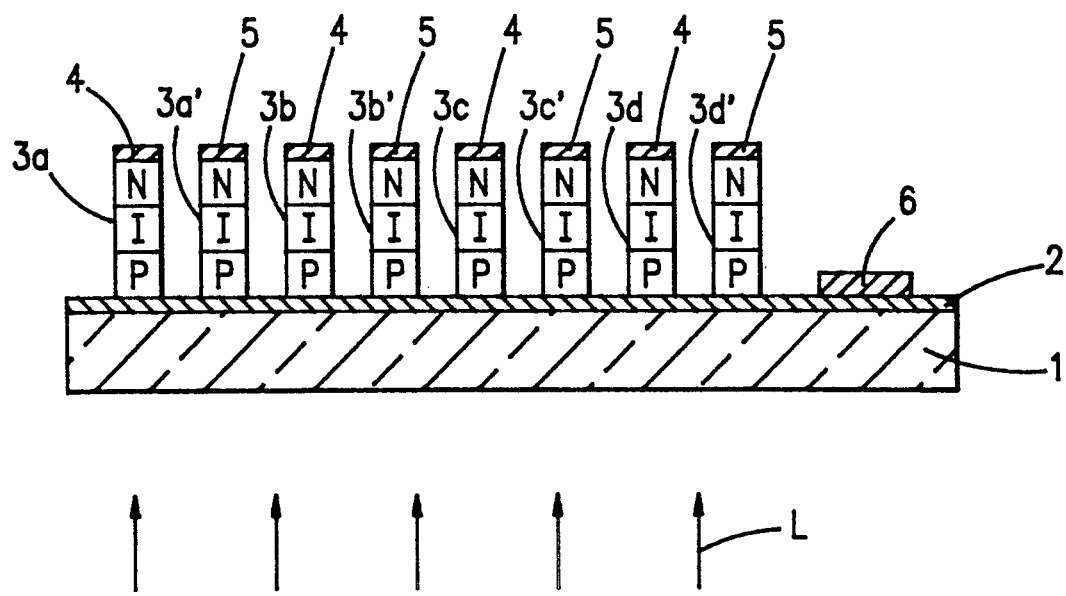

A further embodiment shown in FIGS. 4(a) and 4(b) is a case where a high accuracy is required such as for detecting small amounts of movement. For example, if the electrode patterns of the electrodes 4, 5 are required to be too fine to be sufficiently spaced in the lateral direction with respect to the vertical direction, the a-Si photovoltaic converting element 3 is etched to form separate a-Si photovoltaic converting elements 3a, 3b, 3c, 3d and 3a', 3b', 3c', 3d'. Such formation is achieved by a dry plasma etching with an output of approximately 100 W and using CF$_4$.

In the embodiment of FIG. 4, where electrical separation of the photo-conducting elements is provided, separation of the electrodes 4,5 may be allowed to become comparable with the thickness of the PIN photo-conducting element. The advantage of the invention over the prior art is retained since the formation of the electrodes and the separation of the photo-conducting elements is achieved in a single masking step, enabling more efficient and economical production of a device and which is of higher resolution than was previously available in the art.

Figure 5:
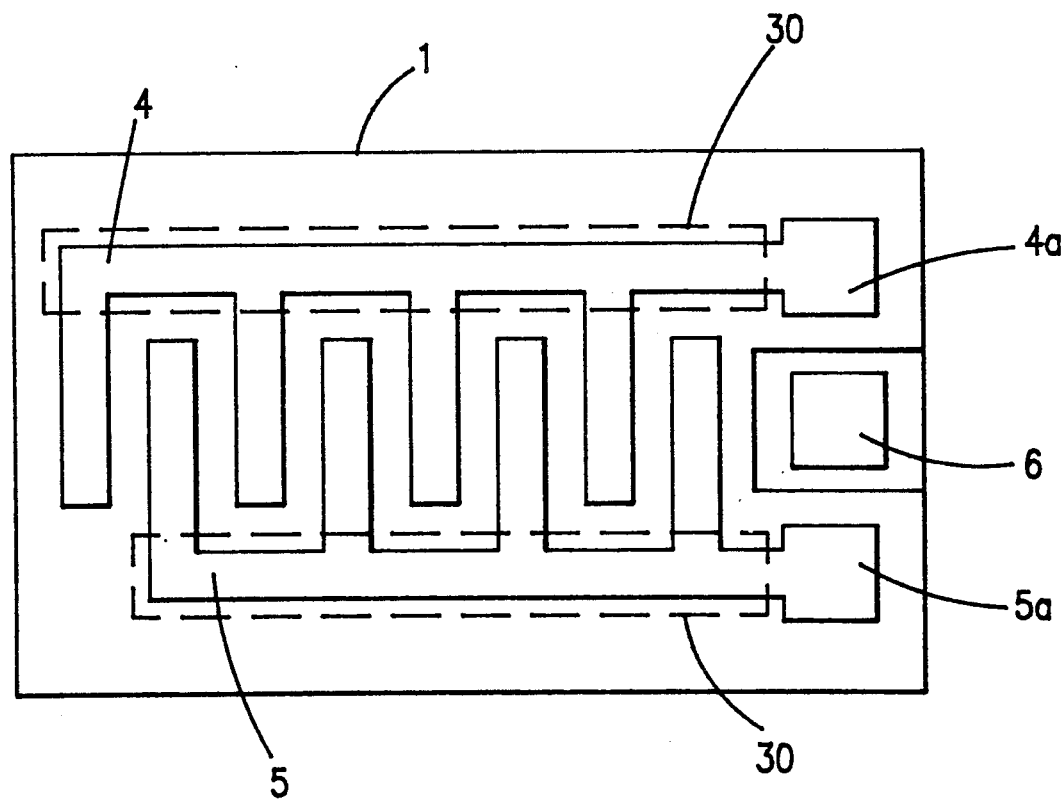
FIG. 4(b) is a cross-sectional view of a main portion of the embodiment shown in FIG. 4(a) and FIG. 5 is a plan view of a still further embodiment of the present invention.

A yet further embodiment shown in FIG. 5 is provided with light shielding layer 30 for shielding electrode portions which do not serve to obtain the output difference (e.g. a differential output), to thereby decrease direct current components in the output signal and accordingly derive a larger differential gain. This feature of increased differential gain is especially desirable in motion detectors to increase the sensitivity thereof. Such a light shielding structure can be applied to any of the above described embodiments.

The structure of FIG. 5 is suitable for forming an a-Si electrovoltaic converting element 3 of large dimensions. Therefore, it is possible, with this structure, to easily achieve a large dimension as well as a high accuracy and a high sensitivity of the a-Si photovoltaic converting element without being influenced by decrease in the yield rate since required etching steps are reduced. Accordingly, a large signal can be derived from the photo-detecting element of the present embodiment so that a signal processing circuit associated therewith can be made at a low cost without necessity of expensive components such as high gain amplifiers. It is also to be appreciated that the optical system can be simplified.

As described above, the photo-detecting element of the present invention is constructed such that at least one electrode layer, placed on at least one side of the a-Si photovoltaic converting element, is made up of one or more electrode patterns forming one or more spatial filters so that the filter shape can be formed by only replacing the filter pattern, without additional spatial filter.

For the electrode pattern employed to form the spatial filter on the a-Si photovoltaic converting element, techniques used for fabricating semiconductor integrated circuits, such as photolithography, can be utilized without modification, making it possible to easily achieve a processing accuracy ranging from several to dozens of $\mu$m and to change the shape of the spatial filter as may be required. This feature of the present invention can extend the scope of the detection, and a suitable shape of the element can be selected in accordance with each purpose. Further, the larger dimension of the photo-detecting element provided by the present invention makes it possible to detect a smaller amount of light than was previously possible, without changing the miniaturization design rule for the a-Si photovoltaic converting element. As an additional advantage the wavelength distribution of the photodetector of the present invention lies in the vicinity of visible light and detection is not affected by transparent elements, such as window glass which may be placed in the field of view of the detector.

Since many changes could be made in the above construction and many apparently widely differing embodiments of the present invention could be made without departing from the scope thereof, it is intended that all matter contained in the above description or shown in the accompanying drawings shall be interpreted as illustrative and not in a limiting sense.

We claim:

1. A photo-detecting element comprising:
   an insulating substrate;
   at least one electrode deposited on said insulating substrate; and
   at least one further electrode;
   at least one of said at least one electrode and said further electrode being shaped to form a spatial filter;
   at least one of said at least one electrode and said further electrode being transparent and
   an amorphous-silicon photovoltaic converting element, having a predetermined thickness, formed between and in contact with said at least one electrode and said further electrode
   wherein said spatial filter has portions thereof separated by a distance which is greater than said predetermined thickness of said amorphous-silicon photovoltaic converting element.

2. A photo-detecting element according to claim 1, further including another further electrode wherein said further electrode and said another further electrode form a pair of further electrodes.

3. A photo-detecting element according to claim 2, wherein said further electrode and said another further electrode of said pair of further electrodes are opposed to each other, forming a pair of opposed electrodes.

4. A photo-detecting element according to claim 3, wherein a gap between opposed portions of said further electrode and said another further electrode of said pair of opposed electrodes is greater than said predetermined thickness of said amorphous-silicon photovoltaic converting element formed between said at least one electrode and said further electrode.

5. A photo-detecting element according to claim 3, wherein said opposed electrodes are formed by electrode patterns for forming spatial filters.

6. A photo-detecting element according to claim 3, wherein said opposed electrodes are formed by a combination of two sets of comb-shaped electrode patterns, and light shielding layers are provided for portions of the opposed electrodes which do not serve to produce an output difference of the comb-shaped electrode patterns.

7. A photo-detecting element according to claim 3, wherein said opposed electrodes are formed by a combination of two sets of comb-shaped electrode patterns, and a common electrode is provided for portions which serve to produce an output difference of the comb-shaped electrode patterns.

8. A photo-detecting element according to claim 3, wherein said amorphous-silicon photovoltaic converting element is formed on said insulating substrate.

9. A photo-detecting element according to claim 3, wherein said amorphous-silicon photovoltaic converting element is formed on said insulating substrate on which active elements are formed.

10. A photo-detecting element comprising:
an insulating substrate;
at least one electrode deposited on said insulating substrate; and
at least a pair of further electrodes;
at least one of said at least one electrode and at least one of said further electrodes being shaped to form a spatial filter;

at least one of said at least one electrode and at least one of said further electrodes of said pair of further electrodes being transparent; and
at least two separated amorphous-silicon photovoltaic converting elements formed between and in contact with portions of said at least one electrode and portions of respective ones of said further electrodes.

11. A photo-detecting element according to claim 10, wherein a gap between respective ones of said further electrodes is approximately the same as a thickness of said amorphous-silicon photovoltaic converting element formed between said at least one electrode and said further electrodes.

12. A photo-detecting element according to claim 10, wherein respective ones of said further electrodes are opposed to each other.

13. A photo-detecting element according to claim 12, wherein said opposed electrodes are formed by electrode patterns for forming spatial filters.

14. A photo-detecting element according to claim 12, wherein said opposed electrodes are formed by a combination of two sets of comb-shaped electrode patterns, and light shielding layers are provided for portions of the opposed electrodes which do not serve to produce an output difference of the comb-shaped electrode patterns.

15. A photo-detecting element according to claim 12, wherein said amorphous-silicon photovoltaic converting element is formed on said insulating substrate on which active elements are formed.

16. A photo-detecting element formed by a process including the steps of
forming at least one first electrode on a substrate;
forming an amorphous silicon photovoltaic converting device of a predetermined thickness of less than approximately 0.6 $\mu$m on said at least one first electrode,
forming a conductive layer on said amorphous silicon photovoltaic converting device, masking selected areas of said conductive layer, and
etching remaining areas in a pattern to form a spatial filter.

* * * * *